(12) United States Patent
Brittles et al.

(10) Patent No.: US 11,114,230 B2
(45) Date of Patent: Sep. 7, 2021

(54) MONITORING DEVICE FOR CRYOGENIC DEVICE

(71) Applicant: Tokamak Energy Ltd, Abingdon (GB)

(72) Inventors: Greg Brittles, Abingdon (GB); Robert Slade, Abingdon (GB); Marcel Kruip, Abingdon (GB); Bas Van Nugteren, Abingdon (GB)

(73) Assignee: Tokamak Energy Ltd., Abington (GB)

( * ) Notice: Subject to any disclaimer, the term of this patent is extended or adjusted under 35 U.S.C. 154(b) by 0 days.

(21) Appl. No.: 16/965,793

(22) PCT Filed: Jan. 30, 2019

(86) PCT No.: PCT/GB2019/050241
§ 371 (c)(1),
(2) Date: Jul. 29, 2020

(87) PCT Pub. No.: WO2019/150091
PCT Pub. Date: Aug. 8, 2019

(65) Prior Publication Data
US 2020/0411217 A1    Dec. 31, 2020

(30) Foreign Application Priority Data

Jan. 30, 2018 (GB) .................................... 1801476
Jul. 25, 2018 (GB) .................................... 1812120

(51) Int. Cl.
*H01L 39/24* (2006.01)
*H01F 6/02* (2006.01)
(Continued)

(52) U.S. Cl.
CPC .......... *H01F 6/02* (2013.01); *G01R 33/3815* (2013.01); *H01F 6/06* (2013.01); *H01F 41/048* (2013.01); *H02H 7/001* (2013.01); *H01L 39/16* (2013.01)

(58) Field of Classification Search
CPC ............ H01F 6/02; H01F 6/06; H01F 41/048; H02H 7/001; G01R 33/3815
See application file for complete search history.

(56) References Cited

U.S. PATENT DOCUMENTS 6,021,337 A * 2/2000 Remillard ............... H01P 7/084
                                                         333/219
8,179,149 B1 * 5/2012 Holly .................. G08B 13/2497
                                                         324/629
(Continued)

FOREIGN PATENT DOCUMENTS

EP         1876609 A1    1/2008
JP         S6452331 A    2/1989
(Continued)

OTHER PUBLICATIONS

International Preliminary Report on Patentability for Application No. PCT/GB2019/050241 dated Aug. 13, 2020 (7 pages).
(Continued)

*Primary Examiner* — Paul D Kim
(74) *Attorney, Agent, or Firm* — Michael Best & Friedrich LLP

(57) ABSTRACT

A monitoring device for use in a cryogenic system. The monitoring device comprises first and second conducting elements and a current detector. The first conducting element comprises high temperature superconducting, HTS, material and is configured for connection to a current source and insertion into the cryogenic system. The second conducting element comprises HTS material and is connected in parallel to the first conducting element by first and second joints. The current detector is configured to detect a current in the second conducting element. When the HTS material in each of the first and second conducting elements is in a superconducting state, the resistance, $R_T$, of the first conducting element between the first and second joints, is less than the (Continued)

sum, $R_B$, of the resistance of the second conducting element between the first and second joints and the resistances of the first and second joints.

31 Claims, 5 Drawing Sheets

(51) Int. Cl.
*G01R 33/3815* (2006.01)
*H01F 6/06* (2006.01)
*H01F 41/04* (2006.01)
*H02H 7/00* (2006.01)
*H01L 39/16* (2006.01)

(56) References Cited

U.S. PATENT DOCUMENTS

| | | | |
|---|---|---|---|
| 10,333,047 B2 * | 6/2019 | Gilbert | .......... H01L 39/126 |
| 2007/0013377 A1 * | 1/2007 | Wosik | .......... G01R 33/3415 324/322 |
| 2011/0177953 A1 | 7/2011 | Llambes et al. | |

FOREIGN PATENT DOCUMENTS

| | | |
|---|---|---|
| JP | 2006332559 A | 12/2006 |
| KR | 2397589 C2 | 8/2010 |
| KR | 1020120018725 A | 3/2012 |
| RU | 2576243 C1 | 2/2016 |
| RU | 2609729 C1 | 2/2017 |
| WO | 2017042541 A1 | 3/2017 |

OTHER PUBLICATIONS

Search Report issued by the United Kingdom Intellectual Property Office for Application No. 1801476.1 dated Jul. 25, 2018 (3 pages).
International Search Report and Written Opinion for Application No. PCT/GB2019/050241 dated May 14, 2019 (12 pages).
English translation of Search Report issued by the Federal Institute of Industrial Property for Application No. 2020128597 dated Jan. 19, 2021 (2 pages).
English translation of Notice of Non-Final Rejection issued by the Korean Intellectual Property Office for Application No. 10-2020-7024961 dated Dec. 22, 2020 (5 pages).

* cited by examiner

MONITORING DEVICE FOR CRYOGENIC DEVICE

FIELD OF THE INVENTION

The invention relates to a monitoring device for a cryogenic system. In particular, the invention relates to a system for monitoring the critical current of superconducting material within the cryogenic system (e.g. a superconducting magnet). This information may be used to detect quenches in superconducting systems.

BACKGROUND

A superconducting magnet is an electromagnet formed from coils of a superconducting material. As the magnet coils have zero resistance, superconducting magnets can carry high currents with zero loss (though there will be some losses from non-superconducting components), and can therefore reach high fields with lower losses than conventional electromagnets.

Superconductivity only occurs in certain materials, and only at low temperatures. A superconducting material will behave as a superconductor in a region defined by the critical temperature of the superconductor (the highest temperature at which the material is a superconductor in zero applied magnetic field) and the critical field of the superconductor (the highest magnetic field in which the material is a superconductor at 0K). The temperature of the superconductor and the magnetic field present limit the current which can be carried by the superconductor without the superconductor becoming resistive (or "normal", used herein to mean "not superconducting"). There are two types of superconducting material: type I superconductors totally exclude magnetic flux penetration and have a low critical field, type II allow flux to penetrate the superconductor above the lower critical field within localized normal regions called flux vortices. They cease to be superconducting at the upper critical field. This feature enables them to be used in wires for construction of superconducting magnets. Significant effort is made to pin the flux vortex sites to the atomic lattice, which improves critical current at higher magnetic fields and temperatures.

Superconducting materials are typically divided into "high temperature superconductors" (HTS) and "low temperature superconductors" (LTS). LTS materials, such as Nb and NbTi, are metals or metal alloys whose superconductivity can be described by BCS theory. All low temperature superconductors have a critical temperature (the temperature above which the material cannot be superconducting even in zero magnetic field) below about 30K. The behaviour of HTS material is not described by BCS theory, and such materials may have critical temperatures above about 30K (though it should be noted that it is the physical differences in superconducting operation and composition, rather than the critical temperature, which define HTS material). The most commonly used HTS are "cuprate superconductors"—ceramics based on cuprates (compounds containing a copper oxide group), such as BSCCO, or ReBCO (where Re is a rare earth element, commonly Y or Gd). Other HTS materials include iron pnictides (e.g. FeAs and FeSe) and magnesium diborate ($MgB_2$).

ReBCO is typically manufactured as tapes, with a structure as shown in FIG. 1. Such tape 500 is generally approximately 100 microns thick, and includes a substrate 501 (typically electropolished hastelloy approximately 50 microns thick), on which is deposited by IBAD, magnetron sputtering, or another suitable technique a series of buffer layers known as the buffer stack 502, of approximate thickness 0.2 microns. An epitaxial ReBCO-HTS layer 503 (deposited by MOCVD or another suitable technique) overlays 15 the buffer stack, and is typically 1 micron thick. A 1-2 micron silver layer 504 is deposited on the HTS layer by sputtering or another suitable technique, and a copper stabilizer layer 505 is deposited on the tape by electroplating or another suitable technique, which often completely encapsulates the tape.

The substrate 501 provides a mechanical backbone that can be fed through the manufacturing line and permit growth of subsequent layers. The buffer stack 502 is required to provide a biaxially textured crystalline template upon which to grow the HTS layer, and prevents chemical diffusion of elements from the substrate to the HTS which damage its superconducting properties. The silver layer 504 is required to provide a low resistance interface from the ReBCO to the stabiliser layer, and the stabiliser layer 505 provides an alternative current path in the event that any part of the ReBCO ceases superconducting (enters the "normal" state).

One problem which can occur in superconducting magnets is quenching. Quenching occurs when a part of the superconducting wire or coil enters the resistive state (sometimes known as "becoming normal"). This may occur due to fluctuations in temperature or magnetic field, or physical damage or defects in the superconductor (e.g. by neutron irradiation if the magnet is used in a fusion reactor). Due to the high currents present in the magnet, when even a small part of the superconductor becomes resistive, it quickly heats up. All superconducting wires are provided with some copper stabilizer for quench protection. The copper provides an alternative path for current if the superconductor becomes normal. The more copper that is present, the slower the temperature rises in the hot spot that forms around a region of quenched conductor.

In LTS magnets, when a quench occurs the "normal zone" will propagate rapidly—on the order of a few metres per second. This occurs due to the low heat capacity of all materials at low temperature, and the fact that LTS materials are generally operated much closer to their critical temperatures. This means that a quench propagates quickly in a LTS magnet, and the stored magnetic field energy dissipated in the quench will be spread throughout the magnet, warming it up uniformly.

The electric field (i.e. voltage per unit length) inside an HTS tape depends on transport current I in a highly non-linear way:

$$E_{HTS} = E_0 \left(\frac{I}{I_C}\right)^n$$

where $E_0 = 1$ µV/cm is the defined critical current criterion, $I_C$ is the critical current of the tape, and n is an experimental parameter that models the sharpness of the superconducting to normal transition; n is typically in the range 20-50 for ReBCO. Depending on the value of n, the voltage is negligible for values of $\alpha = I/I_C$ less than about 0.8. The critical current will be reduced by temperature, external magnetic fields, strain on the tape, and other factors.

HTS materials are operated at high temperatures and have a higher specific heat capacity, so the energy required to bring a section of the wire to the normal state is much greater. This means that quenches in properly designed HTS magnets are much less likely than in LTS magnets. However, it also means that the normal zone propagation velocity is much slower—on the order of a few millimetres per second compared to metres per second in LTS magnets. Since the quench will initially only affect a small volume of the magnet, only that area will be resistive—and therefore the energy dissipated during the quench will be dumped into that small volume (or, more specifically, into the copper where the current from the normal zone is diverted). This concentration of energy can cause permanent damage to the HTS tape, e.g. melting, arc discharge, etc. This is further compounded as HTS magnets are typically indirectly cooled, rather than being immersed in a bath of liquid coolant—so the "spot" cooling power is reduced compared to LTS magnets.

The energy stored in the magnetic field is given by:

$$W+½\int B \cdot H dv$$

I.e. the greater the flux density and the higher the radius, the greater the stored energy of the magnet. The energy released by a large magnet can be on a similar order to a many kilograms of TNT. For an LTS magnet, this energy may be dissipated warming the whole magnet. For an HTS magnet of similar size without quench protection, this energy may be dissipated in a small fraction of the magnet's volume. In general a large HTS magnet will require an active quench protection system comprising a detection phase, during which the quench is detected before significant heating has occurred, followed by a dissipation phase, during which the magnet current is rapidly ramped down before the hot spot temperature rises too high.

Most HTS magnets built to date (using BSCCO and ReBCO coated conductors) do not in fact have quench protection. This is because they are mostly small, low cost prototypes, with little stored energy, and because a quench in a well-designed HTS magnet should have a very low probability, as mentioned. The decision whether to quench protect an HTS magnet is therefore essentially an economic one: a small prototype magnet can be repaired relatively easily in the rare event that it quenches. As a consequence, quench protection technology for HTS magnets is still immature.

One application of HTS magnets is in tokamak fusion reactors. An operating tokamak fusion reactor is a very "noisy" electromagnetic environment in which to make sensitive electrical measurements. This presents a problem for HTS quench detection systems because electromagnetic noise may overwhelm and obscure the typically small voltages which are indicative of a quench occurring, possibly until it is too late to take preventative action.

A quench detection system for a tokamak has been described in WO2016/052712. A conducting element in the form of a length of HTS tape, referred to as "canary tape", is inserted into the magnet of the tokamak and thermally connected to the other conducting elements (tapes) in the magnet whilst remaining electrically insulated from them. The canary tape is connected to a separate power supply and operated at a higher fraction of its critical current than the other tapes in the magnet conductor, such that it ceases to superconduct at a lower temperature (or lower magnetic field/strain/etc) than the other tapes. A voltage will develop when the temperature of the canary tape exceeds this temperature, providing a warning that a hot spot has developed and quench in the magnet is imminent or under way. Such a system could also be used to detect temperature and/or magnetic field changes in other cryogenic or superconducting systems.

However, the voltage across the canary tape is likely to be small and difficult to detect, particularly in systems such as tokamaks which inherently operate with significant electromagnetic noise. There is also a likelihood that the canary tape would be permanently damaged if the quench in the canary tape was not detected quickly enough.

Another potential use of HTS magnets is in proton beam therapy devices. Proton beam therapy (PBT, also known as proton therapy) is a type of particle therapy used in the treatment of cancers (and other conditions which respond to radiotherapy). In PBT, a beam of protons is directed towards the treatment location (e.g. the tumour).

Another, similar therapy is proton boron capture therapy (PBCT), in which boron-11 is introduced to the target location, and a proton beam is used to initiate the $p+^{11}B \rightarrow 3\alpha$ reaction. The same apparatus can be used to provide proton beams for either PBT or PBCT.

The proton beams for PBT and PBCT are generated by particle accelerators such as a cyclotrons or linear accelerators. Accelerators typically used for PBT and PBCT typically produce protons with energies in the range of 60 to 250 MeV, with the most powerful currently operating facility having a maximum energy of 400 MeV.

There are, broadly speaking, two types of design for PBT devices which allow variation of the beam angle. In the first type of design, as illustrated in FIG. 8, the accelerator 3001 is mounted on a gantry 3002, which allows it to be rotated around the patient 3003 (usually about a horizontal axis). The patient is placed on a moveable bed 3004, which provides further degrees of freedom (e.g. translational motion and rotation about a vertical axis).

The second type of design is illustrated in FIG. 9. The accelerator 4001 is stationary, and the beam is directed to the patient via steering magnets 4002 (generally including both quadrupole and dipole magnets), at least some of which are located on a gantry 4003, such that the beam can be rotated around the patient 4004 (e.g. about a horizontal axis). The patient is placed on a moveable bed 4005.

Either design requires that the gantry hold electromagnets capable of steering protons at the beam energy, which could be as high as 400 MeV. This requires very high magnetic fields, and as such the use of HTS magnets can considerably reduce the mass and size of the electromagnets and the gantry needed to move them. HTS magnets may be used within the accelerator, quadrupole magnets of the steering magnets, or dipole magnets of the steering magnets.

Quench detection is of particular importance in a PBT device, as the movement of the gantry may interfere with cooling systems and make hotspots more likely to form. In addition, the HTS magnets are located relatively close to a patient, which means it is of paramount importance that the energy is dumped in a controlled and safe way.

SUMMARY

According to a first aspect of the invention, there is provided a monitoring device for use in a cryogenic system. The monitoring device comprises first and second conducting elements and a current detector. The first conducting element comprises high temperature superconducting, HTS, material and is configured for connection to a current source and insertion into the cryogenic system. The second conducting element comprises HTS material and is connected in parallel to the first conducting element by first and second joints. The current detector is configured to detect a current in the second conducting element. When the HTS material in each of the first and second conducting elements is in a superconducting state, the resistance, $R_T$, of the first conducting element between the first and second joints, is less than the sum, $R_B$, of the resistance of the second conducting element between the first and second joints and the resistances of the first and second joints, $R_T<R_B$.

According to a second aspect of the invention, there is provided a monitoring system comprising a plurality of monitoring devices according to the first aspect and a controller configured to monitor currents detected by each monitoring device.

According to a third aspect of the invention, there is provided a superconducting magnet comprising an HIS field coil and a monitoring device according to the first aspect or a monitoring system according to the second aspect, wherein the or each first conducting element is located adjacent to the HIS field coil.

According to a fourth aspect of the invention, there is provided a quench protection system for use in a superconducting magnet, the quench protection system comprising a monitoring system according the first aspect, and a system for dumping energy from a superconducting magnet. The controller of the monitoring system is configured to identify reductions in critical currents of the first conducting elements of the monitoring devices on the basis of currents detected in the second conducting elements of the respective monitoring devices. The controller is configured to identify conditions likely to result in a quench on the basis of a rapid reduction in critical currents identified for one or more of the monitoring devices. The controller of the monitoring system is configured to trigger the system for dumping energy from the superconducting magnet in dependence upon identification of conditions likely to cause a quench.

DETAILED DESCRIPTION

As noted above, the use of a conducting element in the form of canary tape is hindered by the low signal to noise ratio of the voltage produced, particularly in environments with significant electrical interference (e.g. tokamaks and other high powered magnets—which are among the primary uses of HIS material, and so would otherwise be the most useful systems to protect with canary tape). While this can be partially mitigated by using higher currents in the canary tape to induce a higher voltage when the canary tape becomes normal, producing a measurable voltage in the canary tape would still require a sufficient portion of the canary tape to become normal, such that damage to the canary tape is very likely. While the use of canary tape can prevent damage to the magnets (as it will quench before the main magnet coil), the need to balance between a low signal to noise ratio and the need to replace canary tape reduces its usefulness considerably (and even at high currents, the signal to noise ratio may not be sufficient). As such, it is desirable to provide canary tape with an improved signal to noise ratio.

Figure 1:
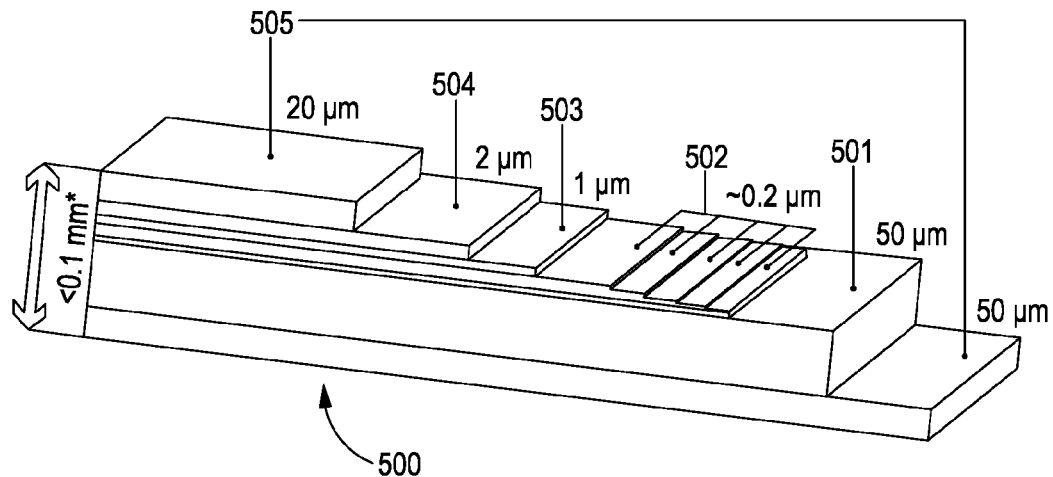
FIG. 1 is a schematic illustration of an HIS tape.
Figure 2:
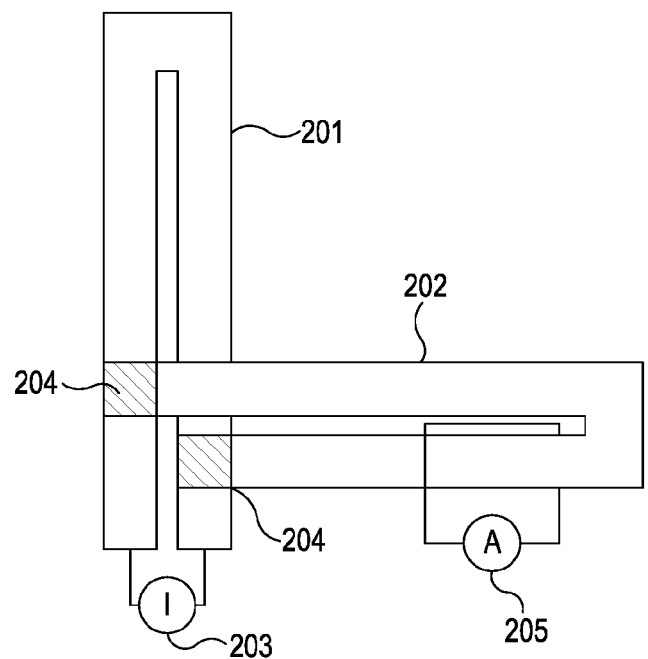
FIG. 2 is a schematic illustration of a monitoring device.

A monitoring device comprising canary tape, allowing the voltage to be measured indirectly, is shown in FIG. 2. The monitoring device of FIG. 2 comprises a first conducting element in the form of canary tape 201 for insertion into a cryogenic system (e.g. inclusion in the coil structure of a superconducting magnet), and a second conducting element in the form of bypass tape 202. Both conducting elements include HIS material (in this example in the form of tape), and are arranged to have minimal inductance (e.g. doubling back on themselves to minimise the area of the loop formed). The HIS material will have no resistance when superconducting, but other parts of the canary tape 201 or bypass tape 202 may be resistive (e.g. joints to allow the tape to "turn a corner"). The canary tape 201 is connected to a current source 203. The bypass tape 202 is connected in parallel with the canary tape via joints 204, which may be resistive. There should be at least some resistive (non-superconducting) material included in a current path which includes the bypass tape and the joints. This resistive material may be present in the joints 204, and/or elsewhere along the bypass tape 202. A current detector 205 is provided to detect current in the bypass tape.

Figure 3:
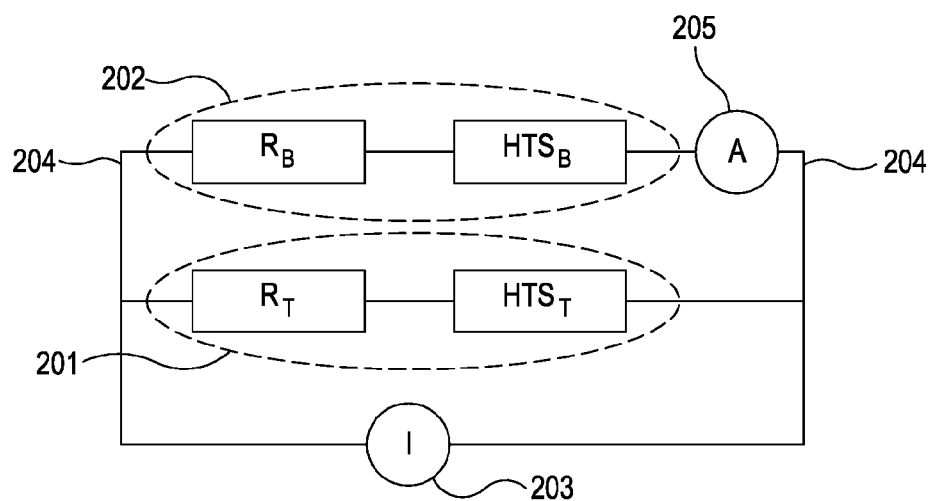
FIG. 3 is the equivalent circuit for the device of FIG. 2.

FIG. 3 shows an equivalent circuit to the arrangement of FIG. 2. The combined resistance $R_B$ of joints 204 and any resistive non-HTS sections of the bypass tape 202 is greater than the resistance $R_T$ of non-HTS sections (if any) of the canary tape 201 between the joints. The resistances $HTS_B$ and $HIS_T$ of the HTS sections of the bypass tape and canary tape respectively are zero when the current through the HTS is significantly less than the critical current, i.e. when both tapes are superconducting. As such, when current is supplied by the current source 203, the current will flow in the canary tape 201 with only a negligible amount flowing in the bypass tape 202, and so little or no current will be detected by the current detector 205.

Where the input current I is a significant fraction of the critical current $I_C$ of the canary tape 201 (e.g. $I>0.8\ I_C$), the resistance $HIS_T$ of HTS material in the canary tape will become significant and a voltage will develop across the canary tape.

$$V_{HTS} = LE_0\left(\frac{I}{I_C}\right)^n$$

Where L is the length of the normal section. This voltage will cause a current to flow via the joints 204 and bypass tape 202. This current is detected by the current detector 205. In practice, this will cause a reduction in the current $I_T$ through the canary tape, and hence a lower voltage, but the principle that a measurable current will flow through the bypass tape when I is close to $I_C$ holds regardless—the actual current $I_B$ is relatively complex to calculate, but can be determined as the solution to a set of simultaneous equations (e.g. Kirchhoff's current and voltage laws, and the expression for $V_{HTS}$ given above), or measured experimentally for calibration purposes. However, such accurate calibration is not necessary for basic functioning of the monitoring device (e.g. for simple quench detection), as any detected current in the bypass tape above background noise indicates that the current in the canary tape is close to the critical current.

As a full quench is not required to provide a measurable voltage on the canary tape, the monitoring device according to the present disclosure can be considered a "critical surface detector" or "critical current detector" rather than only a "quench detector"—i.e. the system of the present disclosure monitors the critical current of the canary tape or detects changes to the critical current, rather than just detecting quenches.

An advantage of the monitoring device described above is that, when the canary tape is placed within a superconducting field coil to detect conditions causing a reduction in critical current, the bypass tape can be placed in an electromagnetically quiet location away from the magnet, so that the current can be measured with less noise.

The main example used in this document will be a superconducting magnet and the use of canary tape to detect conditions which may result in a quench for such a magnet. However, it will be appreciated that the monitoring device disclosed herein may be used in a variety of cryogenic or superconducting systems in order to detect variations in temperature, magnetic field, neutron or ionising radiation flux, strain, or other conditions which may vary the critical current of HTS.

A general advantage of the device is that can be used as a distributed sensor. A very long canary tape allows the user to monitor a large amount of space. There is virtually no limit in size, because there are no ohmic losses or voltage-drops inside a superconductor in its superconducting state. For example, work is being done on the use of superconductors for current transmission over many kilometres. In theory, it would be possible to monitor a cable for such a transmission using a single canary tape along its entire length, potentially replacing hundreds or even thousands of individual localized sensors.

Various techniques may be used to measure the current in the bypass tape, for example:
  the magnetic field produced by the bypass tape may be measured by a Hall probe, or the change in magnetic field may be measured by induction in a loop having a high mutual inductance with the bypass tape;
  a strain gauge may be connected to two parallel sections of the bypass tape, and the force between the sections (which will be dependent on the current, and may be enhanced by providing an additional background field, e.g. using permanent magnets) can be measured;
  other current measurement techniques as known in the art.

The current measurement may take place in a low-field region away from the magnet, and/or within a "magnetic shield" such as a superconducting bulk magnet to screen out any background field.

Various improvements may be made to the canary tape in order to gain more information about the state of the magnet by monitoring the current in the bypass tape.

Figure 4A:
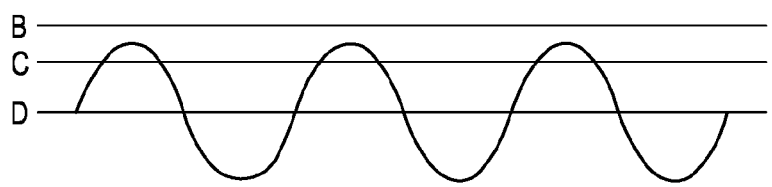
FIG. 4A is a graph showing current applied to a monitoring device.
Figure 4B:
FIGS. 4B to 4D are graphs showing current through the bypass tape of a monitoring device.
Figure 4C:
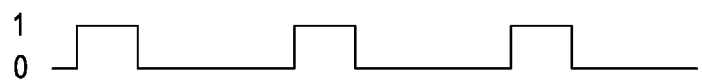
Figure 4D:
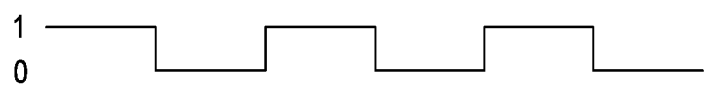

For example, a modulated or AC current may be provided to the canary tape, with a peak value which is close to the expected critical current of the canary tape during normal operation of the magnet. This may be a pure AC current, or a combination of an AC and a DC current (i.e. a modulated current) such that the peak combined current is close to the critical current. The use of a pure AC current allows for the effect of induced currents in the canary tape to be disregarded (as they will have opposite effects on the positive and negative canary tape currents), whereas the use of a combination of AC and DC current can allow increased sensitivity of the detection (as the current spends more of the cycle close to the critical current of the tape) A graph showing an exemplary modulated current waveform is shown in FIG. 4A. FIGS. 4B to 4D show the current measured in the bypass tape where the critical current has values B to D respectively as shown in FIG. 4A. In each case, current only flows in the bypass tape when the current in the canary tape is above the critical current. This example is simplified, in that any current in the bypass tape is noted as "1". In practice, there will be an increasing current in the bypass tape as the current in the canary tape approaches the critical current, but the transition will be relatively sharp. As can be seen, a signal will be measured for a fraction of the critical current period which depends on the critical current of the canary tape. As this signal will be synchronised with the modulated current supplied, phase sensitive ("synchronous") detection techniques as known in the art may be used to increase the sensitivity of the current measurement, e.g. a lock-in amplifier. While the critical current is between the minimum and maximum input current, the lower the critical current in the canary tape, the higher the duty cycle of the output will be (i.e. the more time during each cycle a current above background noise will be detected).

The use of an AC or modulated input current allows the constant monitoring of the critical current of the canary tape. Depending on the changes in critical current in single tapes, and the different critical currents of different tapes, various magnet properties can be inferred. For example, a drop in critical current for a single canary tape or a small group of closely located canary tapes is likely to be due to a temperature rise. A transient or sudden drop in a more widely spaced group of canary tapes (e.g. all of the tapes on a single return limb) is likely due to strain in the magnet or a change in the magnetic field, particularly if the drop in critical current is related to the orientation of the canary tape. A gradual reduction of critical current over time for a large number of canary tapes could be due to neutron damage to the tapes where the tapes are used in a nuclear fusion reactor. Since the canary tapes are located in close proximity to the HIS field coils of a magnet, the critical current reductions of the canary tapes can be used as a proxy to monitor the "health" or stability of the magnet, and if the critical current of the canary tapes falls below a threshold value or the measured critical currents show other undesirable properties, then a quench protection system can be initiated where power is dumped from the magnet (e.g. to a resistive load).

Alternatively or additionally, multiple bypass circuits may be attached to a single canary tape, with each successive bypass circuit having a higher resistance and wherein the total critical current of all bypass tapes except the one with the highest resistance is less than the current supplied to the canary tape (and therefore less than the peak critical current, i.e. critical current at low temperature and in the absence of external magnetic field, of the canary tape). For example, where the current supplied to the canary tape is 100A, a bypass circuit B1 may be provided with a critical current value of 50 A and a resistance R1, and a bypass circuit B2 may be provided with a critical current value greater than 50 A and a resistance R2 which is greater than R1. When the canary tape becomes normal, if the resistance of the canary tape is approximately equal to R1, then approximately 50 A of current will flow in B1 and a small amount (depending on the ratio R2/R1) will flow in B2. When the resistance of the canary tape is approximately equal to R2, 50 A of current will still flow in B1, and a significant portion of the remaining 50 A of current will flow in B2. When the resistance of the canary tape is significantly greater than R2, 50 A of current will flow in B1, and approximately 50 A of current will flow in B2. Therefore, by measurement and calibration of the currents flowing in B1 and B2, the resistance of the canary tape (and hence the severity of any critical current reduction in the canary tape) can be determined to greater precision than with a single bypass tape. Such a sensor is still self-protecting if the sum of the critical currents of all bypass tapes is greater than the current supplied to the canary tape.

In a similar embodiment, a variable bypass resistance may be provided, for example by the use of a potentiometer, by deliberately making sections of the bypass tape normal in a controlled manner, or by heating up a deliberately placed joint in the bypass circuit. By varying the bypass resistance, the resistance of the canary tape can be determined, as the dependence of the bypass current on the bypass resistance will be determined by the resistance of the canary tape and the (known) input current. For example, where the current in the bypass tape is half the input current, the resistance of the canary tape is equal to the resistance of the bypass tape.

When installed in a magnet, the canary tape may pass through regions with different properties, e.g. higher or lower temperatures or magnetic fields, which will cause the critical current to vary along the tape during normal operation of the magnet. In order to counteract this effect, and ensure that the tape is uniformly sensitive along its length, the width of the superconducting tape in the canary tape may be modulated along its length to provide a substantially constant critical current value during normal operation. Alternatively or additionally, wider lengths of canary tape may be constructed by soldering several narrow tapes together.

Figure 5:
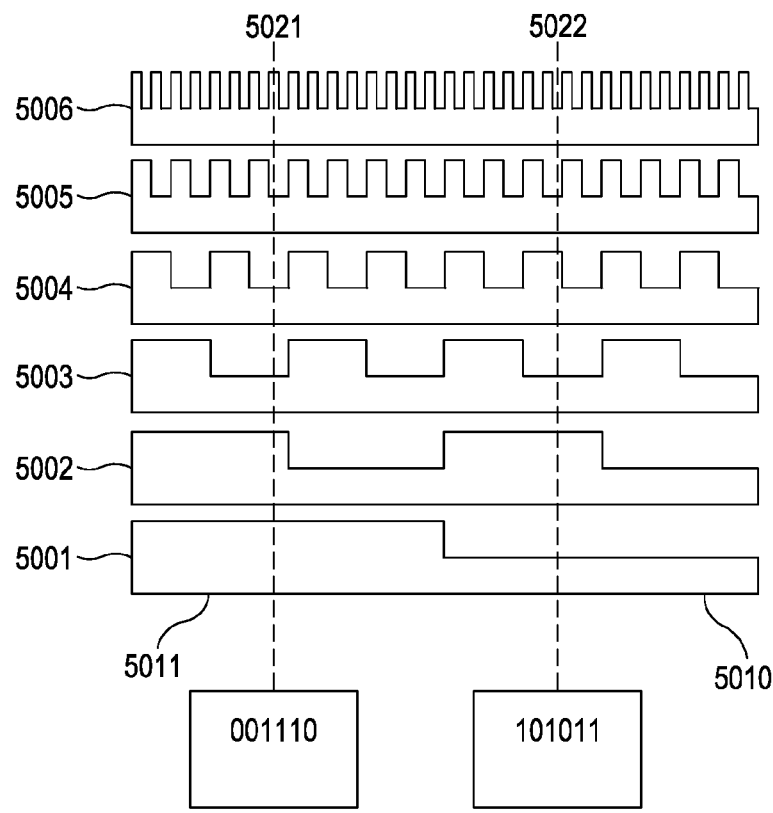
FIG. 5 is a schematic illustration of a set of canary tapes.

With constant width canary tape, or canary tape with modulated width as described in the previous paragraph, it is not possible to determine where along the tape a reduction of critical current has occurred. This can be achieved by providing multiple parallel canary tapes, each having a "measurement width" (i.e. a width providing a reduced critical current, which may be modulated as described previously to provide substantially constant $I_C$) along a part of its length, and a "non-sensitive width" which is greater than the measurement width (and so provides a higher $I_C$) on the rest of its length. By arranging such tracks so that the "measurement width" sections overlap only partially, the location of an $I_C$ reduction can be determined—i.e. the $I_C$ reduction will be detected only on those tapes which have a "measurement width" at the location of the $I_C$ reduction. One exemplary arrangement is shown in FIG. 5, where 6 tapes 5001, 5002, 5003, 5004, 5005, 5006 are provided with "measurement width" 5010 sections, and "non-sensitive width" 5011 sections to form a binary linear encoder—e.g. any location (to a resolution equal to the length of the "measurement width" sections of the tape 5006) can be specified by a binary number, with the tape 5001 providing the leftmost bit, the tape 5006 providing the rightmost bit, and the other tapes arranged accordingly. For example, a critical current reducing event at each of the lines 5021 and 5022 would give the corresponding binary outputs 001110 and 101011 (where "1" represents a current being detected on the bypass tape connected to that canary tape). In order to reduce the current required by the canary tapes, and thus the requirement for high current leads and their associated cooling, the canary tapes may be configured to have a relatively low critical current (e.g. by reducing the width of the tape, or by deliberate degradation of the tape e.g. through de-oxygenation), so that a smaller probe current will still result in sensitive detection. The bypass tape may be provided with a higher critical current than the canary tape, which will result in the canary tape being "self-protecting", as currents sufficiently high to damage the canary tape during a severe reduction in critical current will be redirected entirely into the bypass tape.

Figure 6A:
FIGS. 6A and 6B are schematic illustrations of striated canary tapes.
Figure 6B:
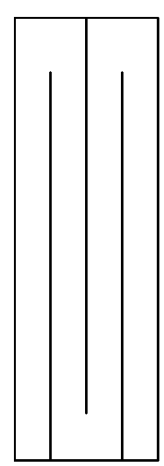

All of the width reductions mentioned above may be achieved by either cutting through the HTS layer of the canary tape (e.g. with a laser or scribing tool), or by heating the canary tape locally using a laser to the point where the HTS layer of the canary tape degrades without cutting the other layers of the tape. Similar techniques may be used to provide a "striated canary tape", where the canary tape loop is provided in a single tape by cutting an odd number of lines which extend from an end of the tape to substantially the other end of the tape, with the lines alternating in the end which they extend from. FIGS. 6A and 6B show example tapes with 1 cut and 3 cuts respectively. The more lines which are cut, the more parallel HTS channels are provided in the tape, and the more sensitive the canary tape will be. This allows for a canary tape to be provided without any resistive sections in the canary tape—meaning that the ideal case where the resistance of the canary tape between the joints is zero can be achieved in practice.

In such a case, it is advantageous for the sensitivity of the canary tape for the total resistance $R_B$ of the bypass tape and joints to be as close to zero as possible, while still being non-zero. However, such a low resistance may, under the influence of an electric field or changing background field, permit parasitic induced currents to flow in the loop created by the bypass tape and canary tape, which will cause noise in the measurements. A higher resistance would cause these induced currents to dissipate more quickly. In practice, the resistance of the bypass tape may be chosen to balance these two factors to achieve an acceptable signal to noise ratio given the conditions in which the canary tape is used. The resistance in the bypass loop may be measured for calibration purposes by deliberately reducing the critical current of the canary tape in a non-permanent way (e.g. by heating or the application of a magnetic field) while keeping the bypass tape superconducting, and applying a current to the canary tape.

Figure 7:
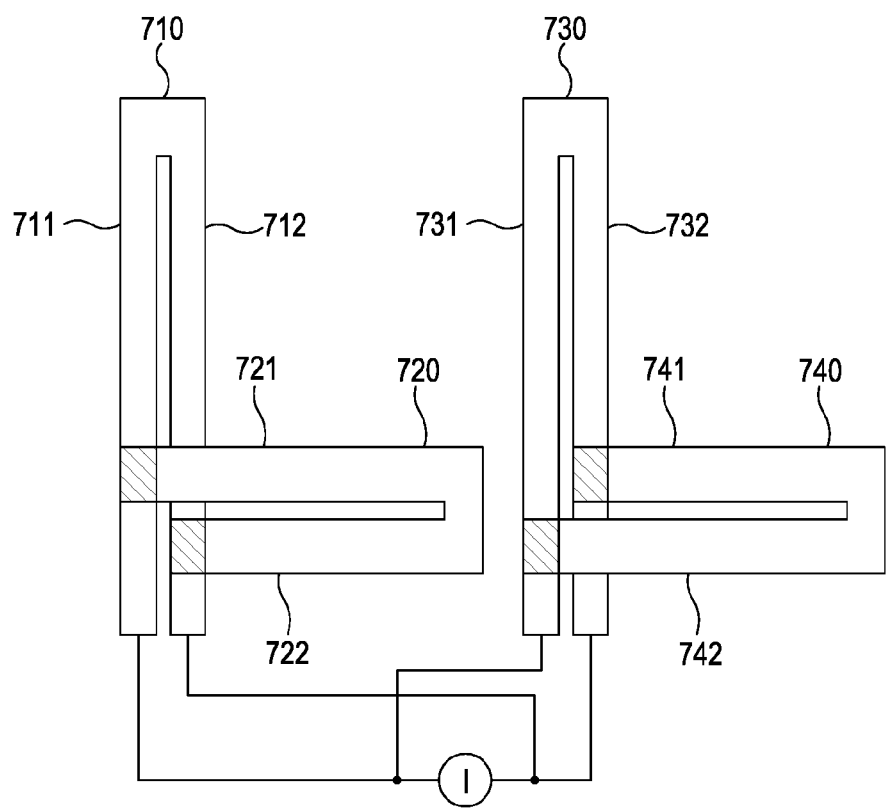
FIG. 7 is a schematic illustration of a pair of monitoring devices.
Figure 8:
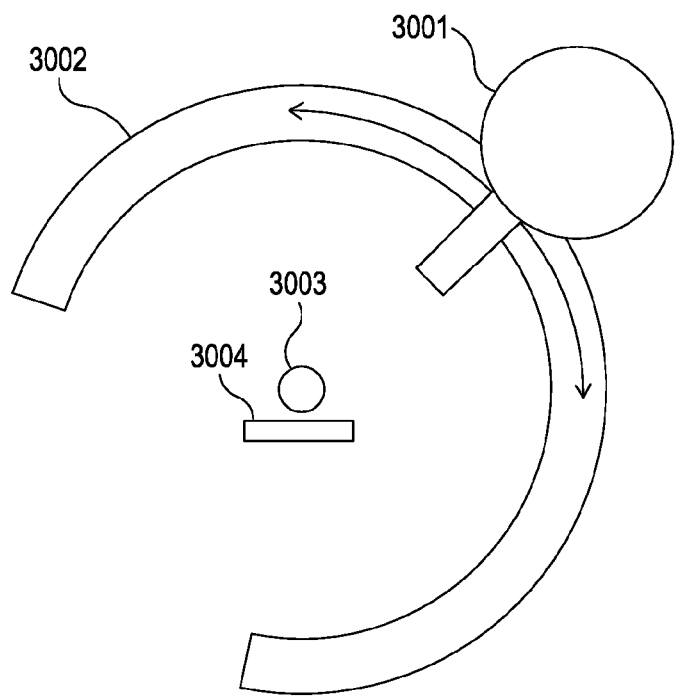
FIG. 8 is a schematic illustration of a proton beam therapy device.
Figure 9:
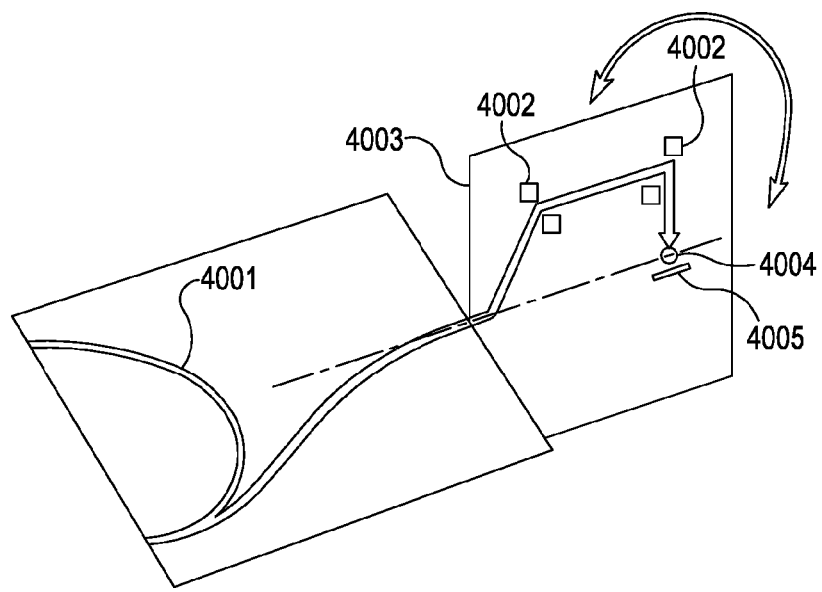
FIG. 9 is a schematic illustration of a further proton beam therapy device.

In order to reduce the effect of induced currents on the critical current detection, canary tapes and bypass tapes may be provided in pairs, with each set of canary tape and bypass tape being connected with an opposite sense, as shown in FIG. 7. The first canary tape 710 is connected to the first bypass tape 720 such that the upper leg 721 of the bypass tape connects to the left leg 711 of the canary tape, and the lower leg 722 of the bypass tape connects to the right leg 712 of the canary tape. The second canary tape 730 is connected to the second bypass tape 740 such that the upper leg 741 of the bypass tape connects to the right leg 732 of the canary tape, and the lower leg 742 of the bypass tape connects to the left leg 731 of the canary tape. Both canary tapes are supplied with current in the same direction (e.g. from the left leg 711, 731 to the right leg 712, 732). The canary tapes 710, 730 are positioned on top of each other, and the bypass tapes 720, 740 are positioned on top of each other. As such, any currents induced on the loops formed by the canary tapes 710, 730 and bypass tapes 720, 740 will be induced in opposite directions, and so combining the measurements of the currents in the bypass tapes 720, 740 will allow the induced currents to be removed.

The canary tape and/or bypass tape need not be made from the same HTS superconductor as that used in the coils of the magnet, or each other. In fact, while the terms "canary tape" and "bypass tape" have been used herein, non-tape HTS superconductors can be used. For example, the canary tape and/or bypass tape may be made from Bi-2212 round multifilamentary wires, whose shape and mechanical properties may permit them to be more easily embedded in advantageous places within the magnet. In general, the canary tape is a first conducting element comprising HTS material, and the bypass tape is a second conducting element comprising HTS material and connected in parallel with the first conducting element.

The monitoring devices may be assembled into a monitoring system, with several such devices connected to a single controller which monitors the currents detected in each bypass tape to determine when the critical current of the canary tape has been reduced. The controller may identify the cause of the reduction depending on the pattern of critical current reductions, as described above. The controller may be connected to a quench protection system for the magnet, and triggered to dump energy from the magnet (via an energy dump system such as a superconducting switch and external resistance, or other energy dumps as known in the art) in dependence upon the critical current reductions identified. For example, if the critical current of an individual canary tape falls below a threshold (either as an absolute value, or as a percentage of the expected critical current of the tape), then the energy dump system may be triggered.

The monitoring devices in such a monitoring system may be connected in series to a single current source, which will result in the same current passing through each canary tape. Alternatively, the monitoring devices may be connected in parallel to a single current source, with each canary tape being connected via a resistor having a resistance much greater (ideally at least an order of magnitude greater, i.e. at least 10 times greater, or at least 100 times greater) than the resistance values in the monitoring device. This will cause the current to divide between the monitoring devices on the basis of those resistances. As a further alternative, the monitoring system may comprise sets of monitoring devices connected in series, which the sets themselves being connected in parallel via a resistor. As a yet further alternative, separate power supplies may be provided for the monitoring devices and/or for sets of monitoring devices connected in series or in parallel.

The above disclosure can be applied to a variety of HTS magnet systems. In addition to the tokamak fusion reactor mentioned above as an example, it may be used for HTS magnets in nuclear magnetic resonance imaging (NMR/MRI) devices, manipulation of magnetic devices within a non-magnetic medium via magnetic fields (e.g. robotic magnetic navigation systems for manipulating medical devices within a patient), and magnets for electric motors, e.g. for electronic aircraft. As a further example, the disclosure may be applied to proton beam therapy devices comprising HTS magnet systems which include the disclosed features, where the HTS magnet systems are used within the accelerator of the PBT device, the quadrupole or dipole steering magnets of the PBT device, or any other magnet of the PBT device.

The invention claimed is:

1. A monitoring device for use in a superconducting or cryogenic system, the monitoring device comprising:
a first conducting element comprising a high temperature superconducting, HTS, material and configured for connection to a current source and insertion into the superconducting or cryogenic system;
a second conducting element comprising a HTS material and connected in parallel to the first conducting element by first and second joints; and
a current detector configured to detect a current in the second conducting element;
wherein, when the HTS material in each of the first and second conducting elements is in a superconducting state, a resistance, $R_T$, of the first conducting element between the first and second joints, is less than a sum, $R_B$, of the resistance of the second conducting element between the first and second joints and the resistances of the first and second joints, $R_T < R_B$.

2. The monitoring device according to claim 1, wherein the first and/or second conducting elements are arranged as one or more pairs of parallel elements, with the elements of each pair being adjacent to each other and configured to carry a current in opposite directions.

3. The monitoring device according to claim 1, wherein the current detector comprises one or more of:
a conductive loop around the second conducting element;
a magnetic field detector;
a Hall probe; and
a strain gauge coupled to two sections of the second conducting element which carry the current in different directions.

4. The monitoring device according to claim 1, and further comprising a current source configured to provide a current to the first conducting element.

5. The monitoring device according to claim 4, wherein the current source is modulated to as to provide a periodic time-varying current.

6. The monitoring device according to claim 5, wherein the current detector comprises a phase sensitive detector.

7. The monitoring device according to claim 5, wherein the current detector is configured to measure a duty cycle of the current in the second conducting element.

8. The monitoring device according to claim 4, wherein the current source is configured to provide a peak current of at least 80% of the critical current of a part of the HTS material of the first conducting element during normal operation of the superconducting or cryogenic system.

9. The monitoring device according to claim 1, wherein the first and/or second conducting element comprise a HTS tape having an HTS layer.

10. The monitoring device according to claim 9, wherein a width of the HTS layer varies within section of the first conducting element between the joints.

11. The monitoring device according to claim 9, wherein the HTS layer is divided into a plurality of strips connected in series.

12. The monitoring device according to claim 1, wherein the current detector is enclosed in a magnetic shield.

13. The monitoring device according to claim 12, wherein the magnetic shield comprises a bulk superconductor.

14. The monitoring device according to claim 13, further comprising a plurality of additional conducting elements comprising HTS material and connected in parallel to the first conducting element.

15. The monitoring device according to claim 1, further comprising a third conducting element comprising a HTS material and connected in parallel to the first conducting element by third and fourth joints, wherein, when the HTS material in each of the first, second and third conducting elements is in a superconducting state, the resistance, $R_T$, of the first conducting element between the first and second joints, is less than a sum, $R_{B2}$, of the resistance of the third conducting element between the third and fourth joints and a resistances of the third and fourth joints, and the sum, $R_{B2}$, of the resistance of the third conducting element between the third and fourth joints and the resistances of the third and fourth joints is less than the sum, $R_B$, of the resistance of the second conducting element between the first and second joints and the resistances of the first and second joints $R_T<R_{B2}<R_B$, and wherein a peak critical current of the HTS material of the third conducting element is less than a peak critical current of the HTS material of the first conducting element, and wherein the current detector is additionally configured to detect a current in the third conducting element.

16. The monitoring device according to claim 1, wherein the second conducting element comprises a variable resistance.

17. The monitoring device according to claim 16, wherein the variable resistance is one of:
   a potentiometer;
   a system for controllably causing the HTS material in the second conducting element to become normal; and
   a joint or section of normal conducting material having a temperature-dependent resistance and a device for controlling the temperature thereof.

18. The monitoring system comprising a plurality of monitoring devices according to claim 1 and a controller configured to monitor currents detected by each monitoring device.

19. The monitoring system according to claim 18, wherein the controller is configured to identify reductions in critical currents of the first conducting elements of the monitoring devices on the basis of currents detected in the second conducting elements of the respective monitoring devices.

20. The monitoring system according to claim 19, wherein the controller is configured to identify a cause of the reduction in critical current on the basis of the pattern of reductions in critical currents identified for the monitoring devices.

21. The superconducting magnet comprising an HTS field coil and a monitoring device according to claim 18, wherein each first conducting element is located adjacent to the HTS field coil.

22. The monitoring system according to claim 18, wherein the controller is configured to identify conditions likely to result in a quench on the basis of a rapid reduction in critical currents identified for one or more of the monitoring devices.

23. The quench protection system for use in a superconducting magnet, the quench protection system comprising a monitoring system according to claim 22, and a system for dumping energy from a superconducting magnet, wherein the controller of the monitoring system is configured to trigger the system for dumping energy from the superconducting magnet in dependence upon identification of conditions likely to cause a quench.

24. The monitoring system according to claim 18, wherein the monitoring devices are arranged in one or more pairs, each pair comprising a first and second monitoring device, wherein:
   the first and second conducting elements of the first monitoring device are arranged adjacent to the respective first and second conducting elements of the second monitoring device; and
   the first and second monitoring devices are arranged such that currents in the first conducting element of the each monitoring device flow in the same direction, and currents in the second conducting element of the each monitoring device flow in opposite directions.

25. The monitoring system according to claim 18, wherein:
   the monitoring devices are arranged in one or more sets, each set comprising monitoring devices having first conducting elements with differing patterns of measurement regions and non-measurement regions along the first conducting element;
   the measurement regions having a reduced critical current compared to the non-measurement regions; and
   the controller is configured to identify a location of conditions causing a reduction in critical current on the basis of detection of current on a subset of the monitoring devices of a set.

26. The monitoring system according to claim 18, wherein the monitoring devices are connected in series.

27. The monitoring system according to claim 18, wherein the monitoring devices are connected in parallel, each monitoring device being connected in series with a respective resistor having at least 10 times the total resistance of the monitoring device.

28. The monitoring system according to claim 18, wherein the monitoring devices are arranged in one or more groups, the monitoring devices in each group being connected in series with a respective resistor having at least 10 times the total resistance of the monitoring devices of the group, and the groups being connected in parallel.

29. The superconducting magnet comprising an HTS field coil and a monitoring device according to claim 1, wherein the first conducting element is located adjacent to the HTS field coil.

30. The tokamak fusion reactor comprising a superconducting magnet according to claim 29, wherein the HTS field coil is one of a toroidal or poloidal field coil.

31. The proton beam therapy, PBT, device comprising a superconducting magnet according to claim 29, wherein the HTS field coil is one of:
   a field coil of an accelerator of the PBT device;
   a dipole or quadrupole magnet of a proton beam steering system of the PBT device.

* * * * *

UNITED STATES PATENT AND TRADEMARK OFFICE
CERTIFICATE OF CORRECTION

PATENT NO. : 11,114,230 B2
APPLICATION NO. : 16/965793
DATED : September 7, 2021
INVENTOR(S) : Greg Brittles et al.

Page 1 of 1

It is certified that error appears in the above-identified patent and that said Letters Patent is hereby corrected as shown below:

In the Claims

At Column 12, Line 23 in Claim 4:
""The monitoring device according to claim 1, and further" should read --The monitoring device according to claim 1, further--

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*